(12) United States Patent
Kellermann

(10) Patent No.: US 8,352,898 B1
(45) Date of Patent: Jan. 8, 2013

(54) CONFIGURATIONS FOR CIRCUIT DESIGNS

(75) Inventor: Martin J. Kellermann, Egmating (DE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/103,975

(22) Filed: May 9, 2011

(51) Int. Cl.
*G06F 17/50* (2006.01)

(52) U.S. Cl. ........ 716/117; 716/116; 716/121; 716/128; 716/138; 716/139

(58) Field of Classification Search .......... 716/116–117, 716/121, 128, 138, 139
See application file for complete search history.

(56) References Cited

U.S. PATENT DOCUMENTS

| | | | |
|---|---|---|---|
| 5,946,216 A * | 8/1999 | Hollerich | 700/223 |
| 6,725,441 B1 * | 4/2004 | Keller et al. | 716/117 |
| 7,139,995 B1 * | 11/2006 | James-Roxby et al. | 716/104 |

OTHER PUBLICATIONS

Xilinx, Inc., "Partial Reconfiguration User Guide", UG702 (v12.3) Oct. 5, 2010, pp. 1-130.
Xilinx, Inc., "Partial Reconfiguration of Virtex FPGAs in ISE 12", White Paper, WP374 (v1.0) Jul. 23, 2010, pp. 1-6.
Xilinx, Inc., "Fast Configuration of PCI Express Technology through Partial Reconfiguration", Application Note: Virtex-6 Family, XAPP883 (v1.0) Nov. 19, 2010, pp. 1-45.

* cited by examiner

*Primary Examiner* — Nghia Doan
(74) *Attorney, Agent, or Firm* — LeRoy D. Maunu

(57) ABSTRACT

A method is provided for preparing a plurality of systems that include respective programmable integrated circuits (ICs) of the same type. A plurality of circuit designs is partitioned into a base design and respective supplemental designs. The base design includes a set of input/output pins utilized by any of the plurality of circuit designs. A supplemental bitstream is generated for each of the supplemental designs. A first bitstream is generated for implementing the base circuit design, a communication module, and a reconfiguration module in a first portion of programmable resources of the programmable IC. The reconfiguration module is configured to program, in response to each respective one of the supplemental bitstreams received via the communication module, a second portion of the programmable resources with the supplemental bitstream to implement a corresponding one of the plurality of circuit designs.

20 Claims, 7 Drawing Sheets

CONFIGURATIONS FOR CIRCUIT DESIGNS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more embodiments generally relate to programmable integrated circuits (IC), and more particularly, to reconfiguration of programmable ICs.

BACKGROUND

Programmable ICs are user configurable ICs capable of implementing digital logic operations. There are several types of programmable ICs, including Complex Programmable Logic Devices (CPLDs) and Field Programmable Gate Arrays (FPGAs). CPLDs include function blocks based on programmable logic array (PLA) architecture and programmable interconnect lines to route and transmit signals between the function blocks. FPGAs include configurable logic blocks (CLBs), input output blocks (IOBs), and programmable interconnect lines that route and transmit signals between the CLBs, between the CLBs and IOBs, and between the IOBs. Each CLB includes look-up tables and other configurable circuitry that are programmable to implement logic functions. The function blocks of CPLDs, CLBs of FPGAs, and interconnect lines are configured by data stored in a configuration memory of the respective devices.

Electronic devices implemented using a programmable IC often include a non-volatile memory that is used to store a configuration bitstream for configuration of the programmable IC when powered on. Traditionally, the entire bitstream for complete configuration of programmable IC is stored in the non-volatile memory during manufacture of the device. Manufactures may produce a number of different boards, which differ in functionality and potentially in layout, but use the same programmable IC to implement different functionality. A different configuration bitstream is likely required for each FPGA-board produced. Using the traditional approach, bitstreams for each of the different configurations must be managed and kept current with the latest design version at the production site. Loading different bitstreams at the production site requires management and reconfiguration of production equipment that may increase production time and expense.

Additionally, updates in the field may not be easily performed. Typical updates, such as firmware updates, reprogram a non-volatile memory containing a configuration bitstream. To configure the programmable IC with the new bitstream, the programmable IC must be power cycled. However, power cycling may require communication interfaces of the programmable IC to be reset as well. For many communication protocols that are not hot swappable, such as PCIe, the external device linked to the programmable IC via the communication channel must be power cycled as well, which may or may not be possible.

One or more embodiments may address one or more of the above issues.

SUMMARY

In one embodiment, a method is provided for preparing a plurality of systems that includes respective programmable integrated circuits (ICs) of the same type. A set of input/output pins of the programmable IC that are utilized by any of a plurality of circuit designs are identified. Each of the plurality of circuit designs is partitioned into a base design and a respective supplemental design. The base design includes at least the set of input/output pins. Each supplemental design corresponds to one of the plurality of circuit designs. A supplemental bitstream is generated for each of the supplemental designs. A first bitstream is generated for implementing the base circuit design, a communication module, and a reconfiguration module in a first portion of programmable resources of the programmable IC. The reconfiguration module is configured to program, in response to each respective one of the supplemental bitstreams received via the communication module, a second portion of the programmable resources with the supplemental bitstream to implement a corresponding one of the plurality of circuit designs. The first bitstream is stored in respective memories of the systems.

In another embodiment, an electronic system is provided. The system includes a non-volatile memory storing a first bitstream and a programmable IC coupled to the non-volatile memory. The programmable IC is configured to program a first portion of programmable resources with the first bitstream to implement at least a communication module, a reconfiguration module, and one or more components included in both a first circuit design and a second circuit design. The reconfiguration module is configured to configure, in response to a second bitstream corresponding to a first circuit design having a first input/output configuration and received via the communication module, a second portion of the programmable resources using the second bitstream to implement the first circuit design. The reconfiguration module is also configured to configure, in response to a third bitstream, corresponding to a second circuit design having a second input/output configuration different than the first input/output configuration and received via the communication module, the second portion of the programmable resources using the third bitstream to implement the second circuit design.

In yet another embodiment, an article of manufacture is provided. The article of manufacture includes a processor-readable storage device that is configured with instructions that, when executed by a processor, cause the processor to prepare a plurality of systems that includes respective programmable integrated circuits (ICs) of the same type. The instructions cause the processor to identify a set of input/output pins of the programmable IC that are utilized by any of a plurality of circuit designs for the programmable IC. The instructions also cause the processor to partition each of the plurality of circuit designs into a base design and a respective supplemental design. The base design includes at least the set of input/output pins. Each supplemental design corresponds to one of the plurality of circuit designs. The instructions also cause the processor to generate a supplemental bitstream for each of the supplemental designs and generate a first bitstream for implementing the base circuit design, a communication module, and a reconfiguration module in a first portion of programmable resources of the programmable IC. When implemented, the reconfiguration module is configured to program, in response to each respective one of the supplemental bitstreams received via the communication module, a second portion of the programmable resources, with the supplemental bitstream to implement a corresponding one of the plurality of circuit designs. The instructions cause the processor to store the first bitstream in respective memories of the plurality of systems.

It will be appreciated that various other embodiments are set forth in the Detailed Description and Claims, which follow.

BRIEF DESCRIPTION OF THE DRAWINGS

Various aspects and advantages of embodiments of the invention will become apparent upon review of the following detailed description and upon reference to the drawings in which:

FIGS. 5-1 through 5-3 illustrate relocation of pins from instantiation in a top level of the design to a lower level of the design hierarchy and partitioning the design into base and supplemental parts

DETAILED DESCRIPTION OF THE DRAWINGS

One or more embodiments provide a method of configuring a plurality of programmable ICs of the same type. A single generic bitstream that is suitable for different circuit designs is generated from those circuit designs. The generic bitstream may be loaded on the programmable ICs of the same type, which may reside on different boards implementing different systems. The generic bitstream implements a circuit which facilitates reconfiguration of the programmable IC, as well as a base set of functions that are common to all the circuit designs. Along with the generic bitstream generated from the different circuit designs, respective supplemental bitstreams are generated. At a production site, the generic bitstream is stored in a non-volatile memory of each board. The generic bitstream implements circuitry that supports partial reconfiguration of the programmable ICs by an end-user with any one of the supplemental bitstreams in order to implement the desired application on each particular one of the different boards.

In one or more embodiments, the generic bitstream is loaded and a supplemental bitstream is retrieved for partial reconfiguration each time the programmable IC is powered on. The update may be initiated by the programmable IC or may be initiated by an external device via an established communication channel such as PCI express (PCIe), for example. In some embodiments, the supplemental bitstream may also be stored in a non-volatile memory of the circuit board and used to configure the programmable IC at power-on without repeating the partial configuration.

Figure 1:
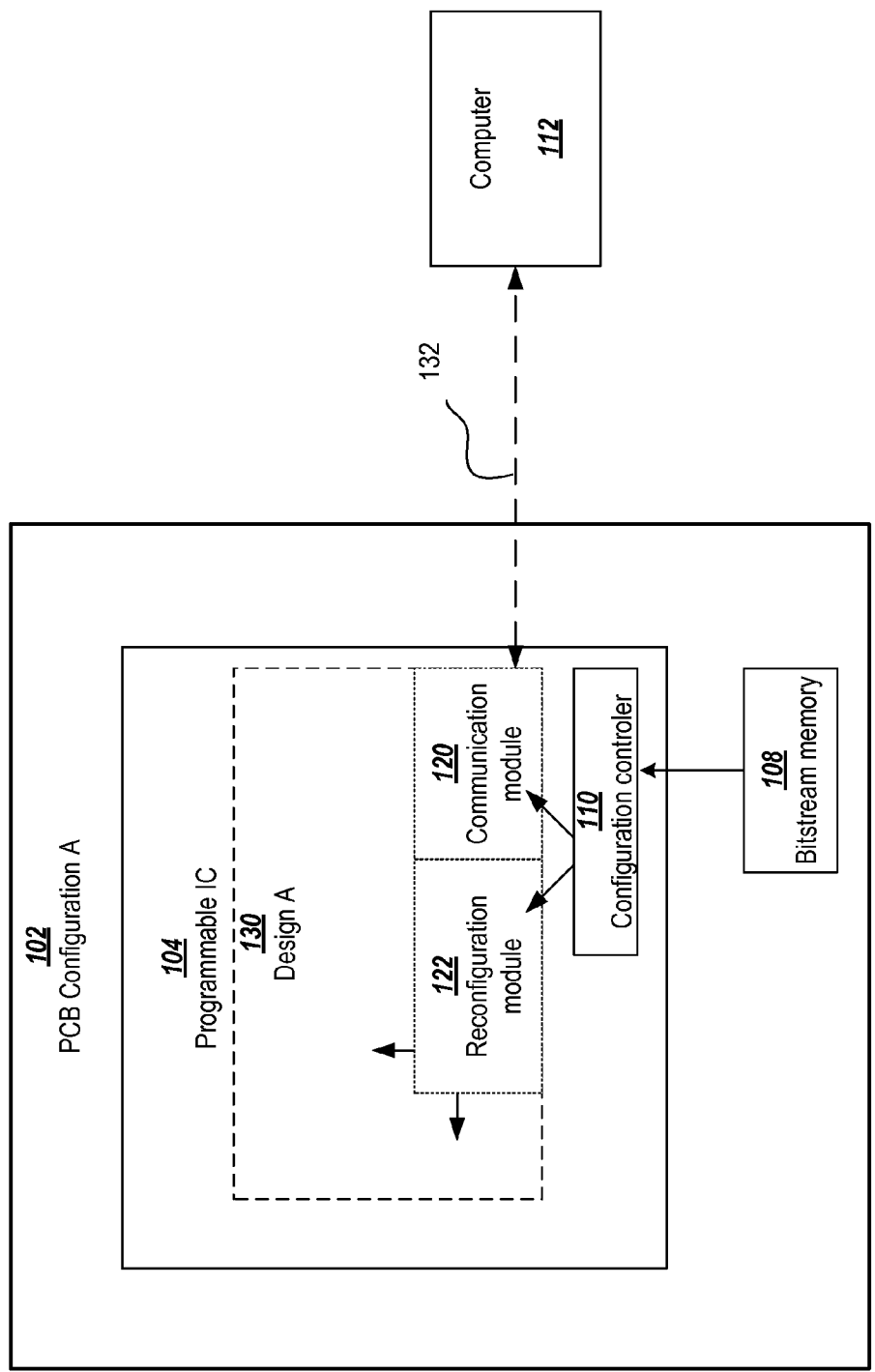
FIG. 1 illustrates reconfiguration of an FPGA with a supplemental bitstream.
Figure 2:
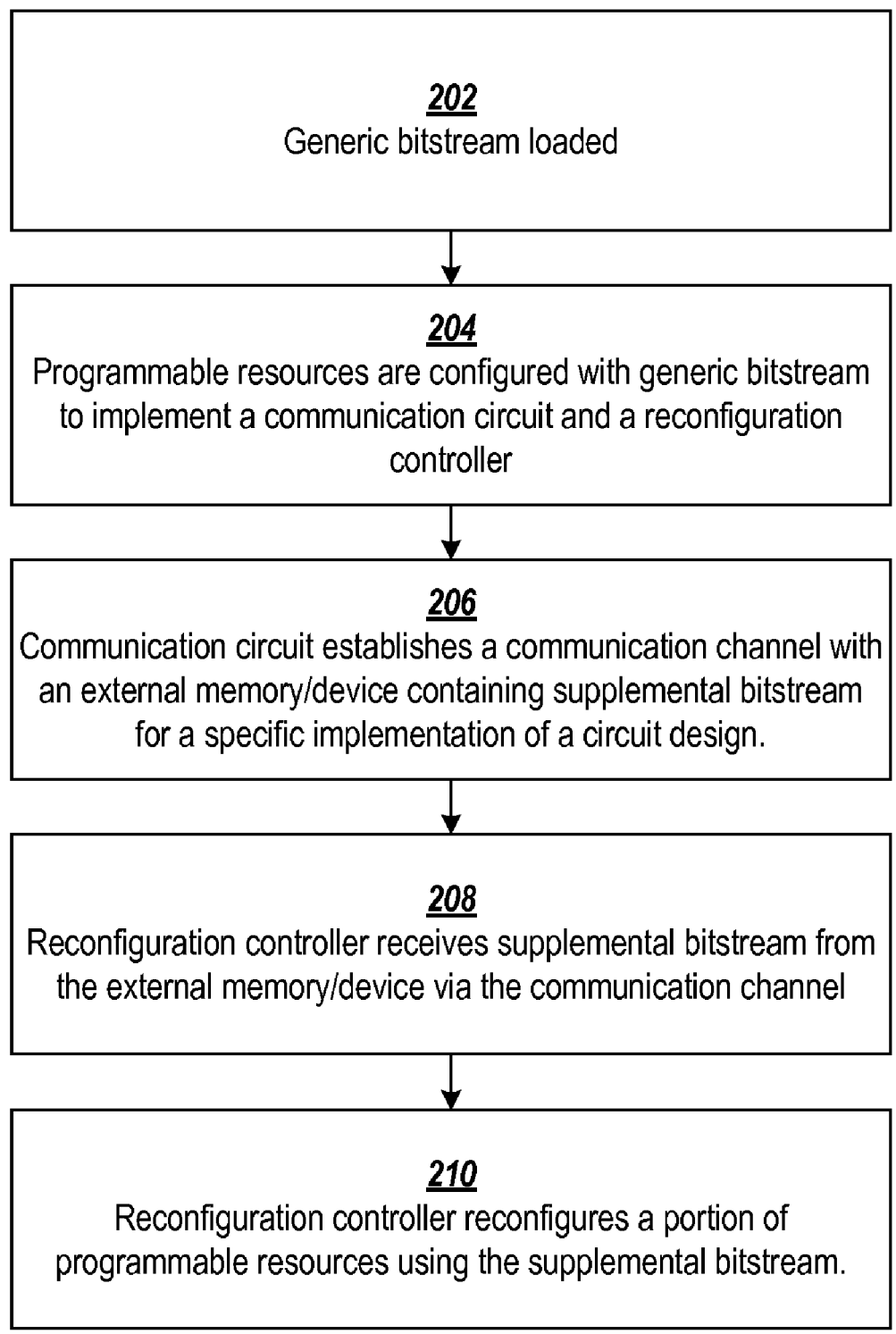
FIG. 2 shows a flowchart of an example process for reconfiguration.

It is recognized that the communication channel may be established using a number of different communication protocols including PCIe, ISA, Serial ATA, JTAG, etc. For communication protocols that are not hot-pluggable, the embodiments allow the programmable IC to be partially reconfigured without cycling power. Because power cycling is avoided non-hot-pluggable communication channels can be maintained and reset of a linked external device can be avoided. For ease of explanation, the embodiments and examples are primarily described with references to PCIe FIG. 1 illustrates configuration and reconfiguration of a programmable IC with generic and supplemental bitstreams. FIG. 2 shows a process for performing partial reconfiguration. For ease of description, FIGS. 1 and 2 are discussed together. A printed circuit board (PCB) 102 includes a programmable IC 104 and a bitstream memory 108. A generic bitstream is loaded into bitstream memory 108 on PCB 102 at a production facility at block 202. At startup of the programmable IC 104, the generic bitstream is used by a configuration controller 110 of the programmable IC 104 to implement a generic design using programmable resources of the programmable IC at block 204. In this example, the generic design implements a communication module 120 and a reconfiguration module 122 that controls partial reconfiguration. The generic design also implements a base design including some circuits common to each of the supplemental designs (not shown). After completing the initial configuration with the generic bitstream, at block 206, communication module 120 establishes a connection over a communication channel 132 with an external device, such as computer 112 or a memory (not shown), and at block 208 a supplemental bitstream specific to the configuration of PCB 102 is retrieved. The supplemental bitstream is used by the reconfiguration module 122 to implement circuit design 130 at block 210, which is compatible with PCB 102.

The above process may be useful for a number of applications in which a device including a programmable IC is linked to and communicates with a PC-based system using system-specific software. In one scenario, the system specific software configures in the programmable IC only functionality that has been licensed to the end-user. An example combination is a board using PCIe in a standard PC where at bootup of the PC some interaction with the system implemented by the programmable IC is necessary. Each software release of the system-specific software for the PC may also include the latest supplemental bitstream. In this manner, the configuration of the programmable IC may be kept current without having to ensure updates are implemented during production.

It is recognized that partial reconfiguration of many programmable ICs may place some limits on the reconfigurability. For example, for some programmable ICs, some circuits cannot be instantiated or reconfigured via partial reconfiguration. In one or more embodiments, these circuits may be identified and instantiated in the base design with a configuration that is compatible with each of the complete designs. For example, if digitally controlled impedance (DCI) is to be used in one of the complete designs and DCI cannot be activated by partial reconfiguration in the programmable IC, DCI may be required to be used in the appropriate bank in the base-design. As another example, global clocking-resources may be required to be included in the generic design. The number of resources of, e.g. number of mixed mode clock managers (MMCMs) must be equal to the number of MMCMs implemented by the final design. However, the appropriate parameters to output the correct frequencies can be modified at run-time using the dynamic reconfiguration port present on these components. Of particular significance, a number of reconfigurable input/output resources must be included in the base design to allow each supplemental bitstream to implement the respective complete design with the input/output resources. In some embodiments, the base design may also instantiate other circuitry common to each of the different bitstream configurations.

Figure 3:
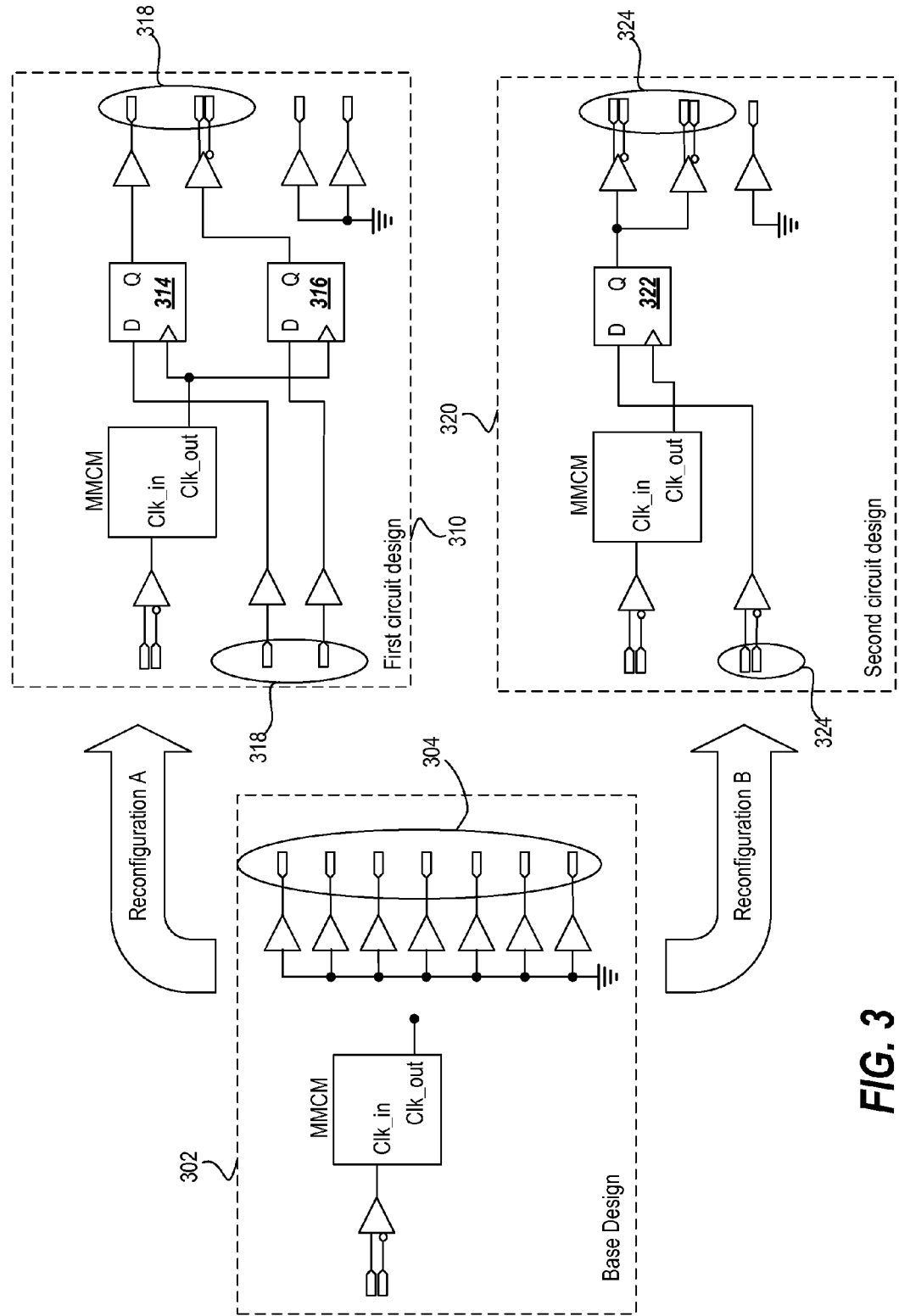
FIG. 3 illustrates an example reconfiguration of a base design into multiple distinct circuit designs.

FIG. 3 illustrates an example partial reconfiguration of a base circuit design. In this example, the base design includes a static portion including an MMCM implementing global clocking. The base design 302 instantiates a number of "dummy" pins 304 sufficient to later implement any one of the circuit designs 310 or 320. In this example, the dummy pins 304 are instantiated in the generic design 302 as output pins. It is recognized that with some software design tools or programmable ICs, instantiated input pins may easily be reconfigured to output pins, but output pins may not be reconfigured as input pins. Other software design tools may allow output pins to be reconfigured as input pins but may not allow input pins to be reconfigured as output pins.

In the example of FIG. 3, the first circuit design 310 implements two additional flip-flops 314 and 316 and reconfigures five pins 318 of the dummy pins 304 to implement the supplemental circuit design 310. Similarly, the second circuit design implements one flip-flop 322 and reconfigures six pins 324 of the dummy input pins 304 of the generic design.

Figure 4:
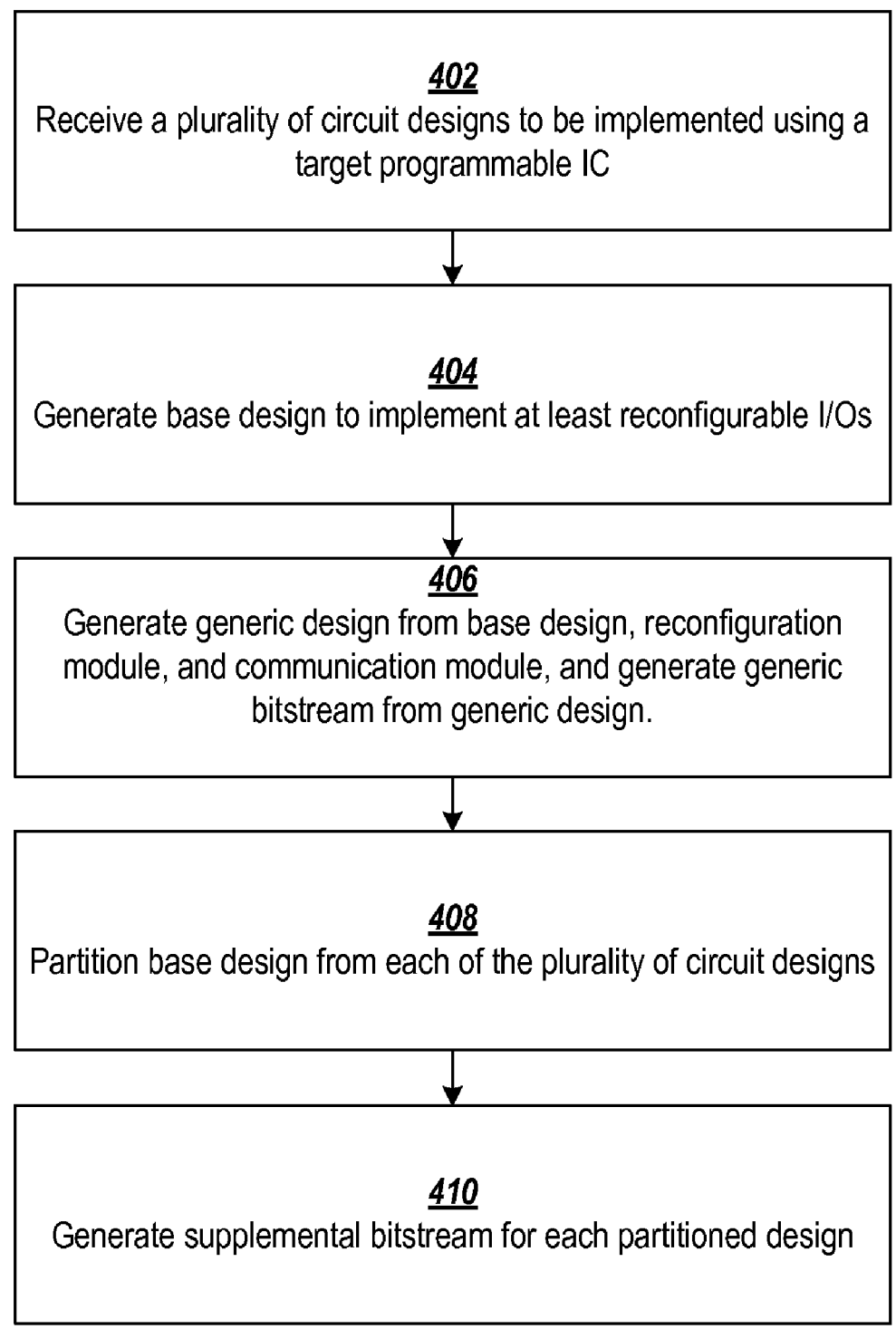
FIG. 4 show a flowchart of an example process for generating generic and supplemental bitstreams for a plurality of circuit designs.

FIG. 4 shows a flowchart of an example process for generating generic and supplemental bitstreams for a plurality of circuit designs. A plurality of circuit designs, to be implemented using a target programmable IC, is received at block 402. A base design implementing reconfigurable I/O resources is generated at block 404. A generic design is generated at block 406 from base design, a reconfiguration module and a communication module. A generic bitstream implementing the generic design is also generated at block 406. The base design is partitioned from each of the plurality of circuit designs at block 408. A supplemental bitstream is generated at block 408 for each partitioned design generated at block 410.

For many programmable ICs, if the placement of I/O resources is chosen correctly during placement and routing of the generic design, the I/O resources can be fully changed in functionality. For example, two single-ended outputs may be reconfigured into one differential input if the original placement of the two single-ended outputs is compatible with placement of a differential input buffer of the supplemental design. Compatibility is indicated by the existence of a viable placement and routing solution for each respective circuit design. It is recognized that in many partial reconfiguration designs, the generic design may include a number of I/O resources that do not get reconfigured regardless of the different reconfiguration designs. For I/O resources to be reconfigurable, the resources need to be moved into the dynamic parts of the design.

In one implementation, this may be accomplished in VHDL by having all application-specific I/O resources as one wide bus in a top-level of the circuit design and declared as INOUT. Appropriate dynamic modules are added to instantiate the buffers in a lower level of the design hierarchy. It will be recognized that the I/O type INOUT must be supported for partial reconfiguration by the design implementation-tools.

When ports between levels of the design hierarchy are not allowed to be of the type INOUT by the design implementation tools, ports may be created in a lower level of the design-hierarchy, without bringing them to the top-level.

Figures 1, 5:
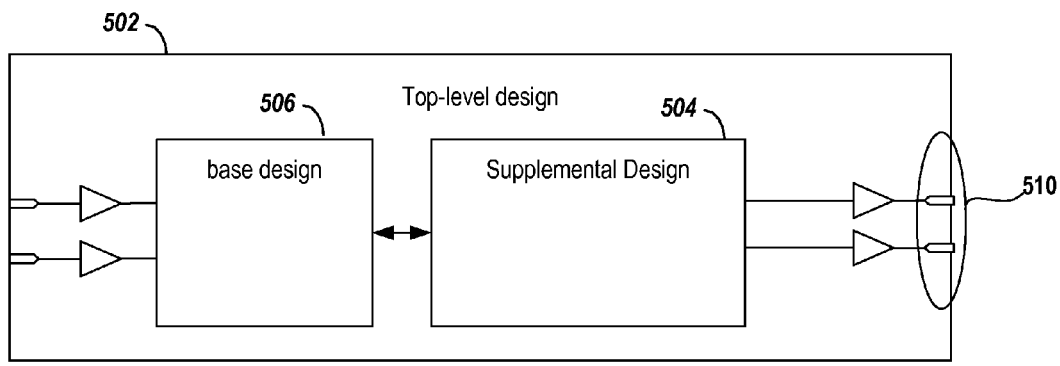
Figures 2, 5:
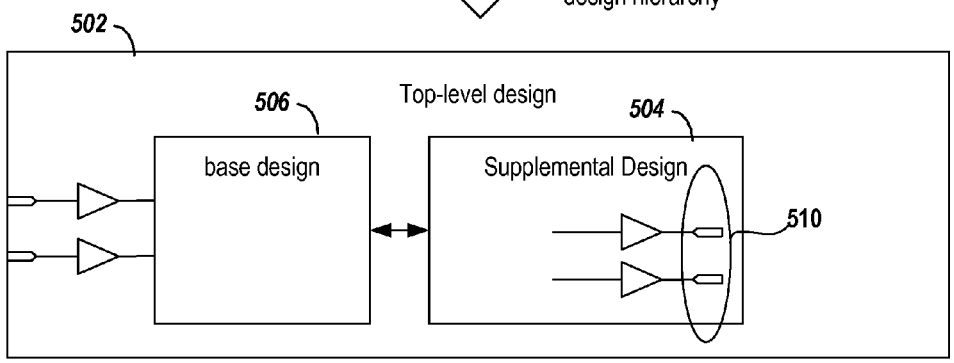
Figures 3, 5:
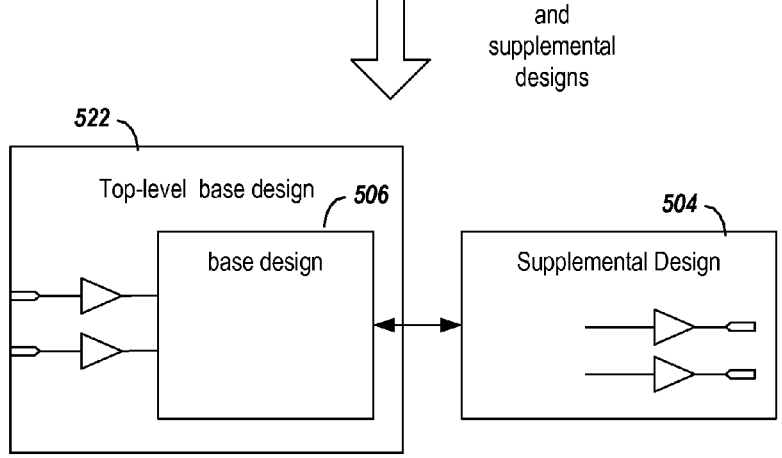

FIGS. 5-1-5-3 illustrate relocation of pins from instantiation in a top level of the design to a lower level of the design hierarchy and partitioning the design into base and supplemental parts. The relocation facilitates extraction of the supplemental portion of the design. In FIG. 5-1, the top-level design 502 has two output pins 510 that are used by the supplemental design 504. Instantiation of these output pins 510 is moved from the top level of the design 502 to a lower-level module that implements the supplemental design 504 as shown in FIGS. 5-2. Following relocation of pin instantiation to the lower level, supplemental design 504 and the base design 506 may be partitioned into separate designs shown as supplemental design 504 and top-level base design 522 in FIGS. 5-3. It will be appreciated that once partitioned, the top-level base design and supplemental design may be separately processed into configuration bitstreams.

Figure 6:
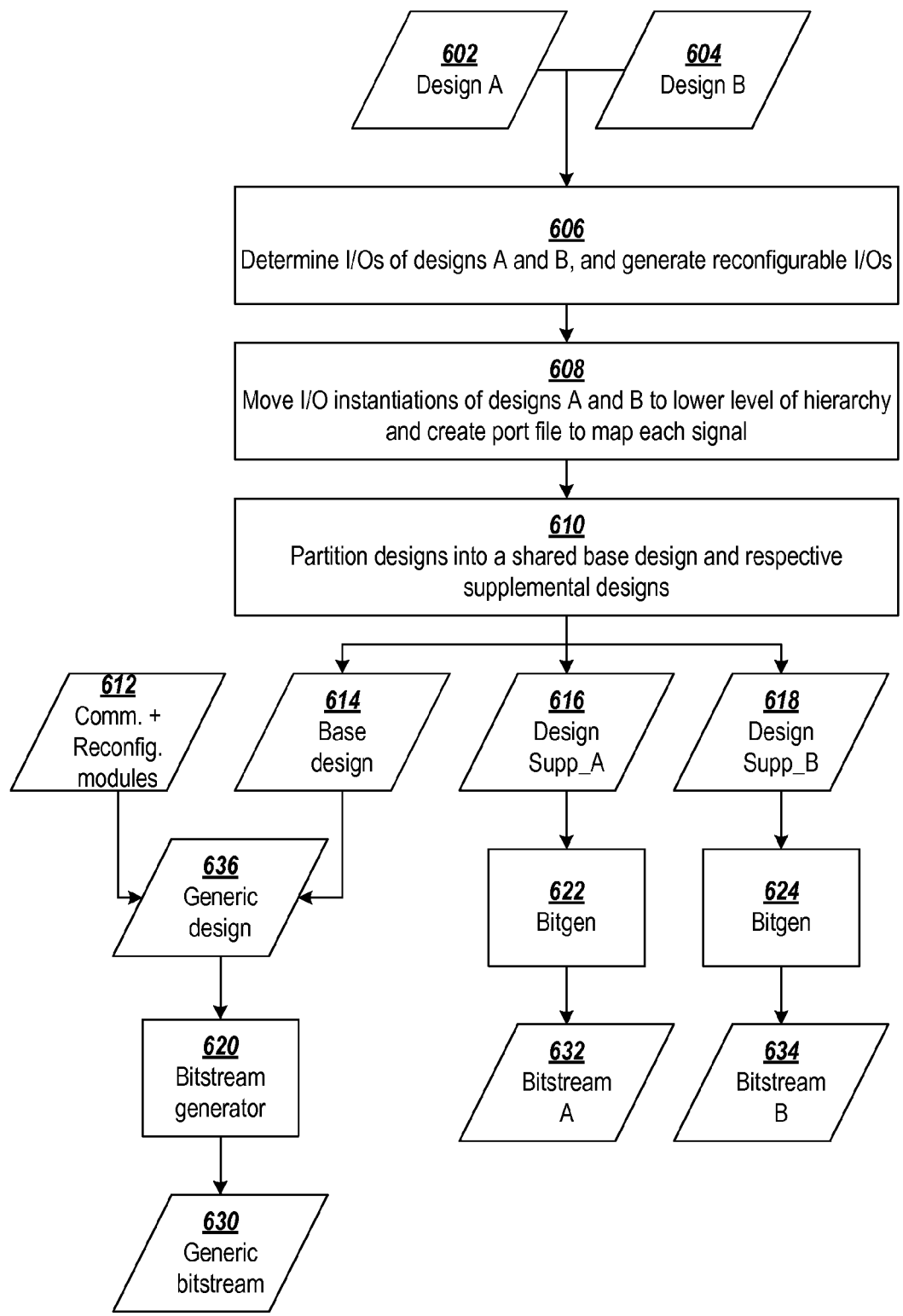
FIG. 6 illustrates the processes shown in FIG. 4.

FIG. 6 illustrates an example in which the process shown in FIG. 4 is applied to circuit designs A and B. Two circuit designs, Design A 602 and Design B 604, are received. A maximum number of I/O resources needed to implement the circuit designs A or B is determined, and those resources are instantiated at block 606. In some embodiments, circuits common to designs A and B may also be identified and included in the base design at block 606. Instantiations of I/O resources to be reconfigured in designs A or B are moved to a lower level of the design hierarchy in designs A and B at block 608. A port file is also created at block 608 to map signals to the I/O resources that are instantiated in the lower level of the hierarchy to a top level of the design. Each design is partitioned into the same base design and respective supplemental designs at block 610. Once partitioned, the base design 614 is combined with communication and reconfiguration modules 612 to form a generic design 636. A generic bitstream 630 is generated from the generic design 636 using a bitstream generator at block 620. For programmable ICs such as FPGAs, a bitstream generator such as Bitgen from XILINX, Inc. may be used. Supplemental bitstreams 632 and 634 are respectively generated with Bitgen at blocks 622 and 624 from supplemental designs Supp_A 616 and Supp_B 618 that were generated in block 610.

In many design tools, I/O resources that are instantiated at a lower level of the hierarchy without connection to the top-level are removed in optimizations made by the implementation software. As a result, dummy pins included in the base design may be identified as unused components and automatically removed for optimization.

In one embodiment, these optimizations may be prevented by logically combining the pins in a generic configuration. For example, the base design 302 shown in FIG. 3 connects output pins 304 to ground. Alternatively, dummy pins may be implemented using input type pins. The input type dummy pins may be connected to a logic AND gate with an output of the AND gate routed to an output pin.

In some implementations, in order to prevent optimization, it may be necessary to constrain placement of the I/O resources using LOC constraints (e.g., in VHDL), indicating which pin(s) of the programmable IC the I/O should be connected. For example, a LOC constraint may be provided as an attribute in VHDL in the following format:

attribute LOC of <signal-bus>: signal is "<comma-separated list of I/O pins>;

The LOC constraints do not have to be permanent and may be overridden in a later stage of the implementation. In one implementation an LOC constraint may be placed on every I/O of the design to prevent the I/O resources from being removed from the design during optimization.

Example 1 shows example VHDL code to instantiate single ended outputs in a lower hierarchical level of the design. The insertion of single-ended outputs into a design intended for the fully updating partial reconfiguration-flow is straight forward.

library IEEE;
use IEEE.STD_LOGIC_1164.ALL;

```
library UNISIM;
use UNISIM.VComponents.all;
entity bridge is
Port (CLK: in STD_LOGIC)
    );
end bridge;
architecture Behavioral of bridge is
signal output_pin: std_logic;
signal logic_output: std_logic;
attribute LOC: string;
attribute LOC of output_pint: signal is "A1";
begin
process (CLK)
begin
    if rising_edge (CLK) then
        logic_output<=<something_happens_here>;
    end if;
end process;
outp_buf: obuf port map(
    I=>logic_output,
    O=>output_pin;
end Behavioral
```

EXAMPLE 1

The Xilinx Unisim-library is declared in the design and is used to instantiates an OBUF-component. The input of the OBUF is a signal from the design-module. The output is a signal that is not connected further. Additionally, the output-signal receives a LOC-constraint via a VHDI-attribute. The output of the OBUF will be placed on the IOB specified in the LOC-attribute. However, the LOC attribute can be overridden by a different value in the UCF-file during implementation.

Example 2 shows example VHDL code to instantiate single ended inputs in a lower hierarchical level of the design. A slightly different approach is to instantiate inputs into a lower level in comparison to Example 1. If simply an IBUF is instantiated and provided with a LOC-constraint, the synthesis-tool may recognize that an unconnected input is present and automatically connect that input to ground, which may lead to the situation of multiple drivers on one component. The implementation shown in Example 2, avoids this scenario by instantiating a bi-directional buffer (IOBUF) where the bi-directional pin is unconnected and the output-path is disabled by forcing the T-input of the IOBUF to a logic One. During synthesis and place and route the output-path will be recognized as not operational and hence optimized out. In the final netlist of the design, only an input will be available.

```
library IEEE;
use IEEE. STD_LOGIC_1164.ALL;
library UNISIM;
use UNISIM.VComponents.all;
entity bridge is
Port (CLK: in STD_LOGIC)
    );
end bridge;
architecture Behavioral of bridge is
signal output_pin: std_logic;
signal logic_output: std_logic;
attribute LOC: string;
attribute LOC of output_pint: signal is "A1";
begin
process (CLK)
begin
    if rising_edge (CLK) then
        <something_happens_here> <=logic_output;
    end if;
end process;
inp_buf: iobuf port map(
    IO=>logic_output,
    T=>'1',
    I=>'0',
    O=>output_pin;
end Behavioral
```

EXAMPLE 2

Example 3 shows example VHDL code to instantiate differential output in a lower hierarchical level of the design. Similar to the instantiation of single-ended output buffers, instantiation of differential output-buffers may not be possible in many software design tools using the partial reconfiguration-flow. One work-around is to instantiate hard macros. A hard-macro contains the fixed information of the differential I/O, the internal connections necessary, and the I/O-standard and is instantiated similarly to any other netlist-based core. Hard-macros in general are a part of a design that has been hand-placed and hand-routed in FPGA Editor. They can contain various programmable resources which are 100% re-used in a design where they are used. The hard-macro can be either created by the user or provided by the author of this document.

```
library IEEE;
use IEEE. STD_LOGIC_1164.ALL;
library UNISIM;
use UNISIM. VComponents.all;
entity bridge is
Port (CLK: in STD_LOGIC)
    );
end bridge;
architecture Behavioral of bridge is
component obufds_pr port)
    LOGIC_OUTPUT: in std_logic);
end component;
signal logic_output: std_logic;
begin
process (CLK)
begin
    if rising_edge (CLK) then
        logic_output<=<something_happens_here>;
    end if;
end process;
diff_outp_buf: obufds_pr port map (
    LOGIC_OUTPUT=>logic_output);
end Behavioral
```

EXAMPLE 3

The macro is declared as a component in VHDL with the correct name and port-list. If both are correct and an NMC-file with an identical file-name is present, it will be connected into the design. No LOC-attribute in VHDL is necessary for the hard-macro. The hard-macro may be constrained using a UCF-file for the design-module. When using such NMC-macros the user should be aware that place and routing tools, such as PlanAhead, may not, automatically copy these into the implementation-directories.

To run the implementation, the user may copy the NMC-macros manually into the implementation-directory of the current configuration and restart the implementation by running the auto-generated batch-file "runme.bat" in that directory. It is important to use this batch-file instead of manually starting the implementation as this batch-file provides the link into PlanAhead. If the batch-file is used, PlanAhead is kept aware of the status and updates of this configuration. A similar approach may be used to instantiate Differential inputs as well.

The reduced port-map, resulting from the instantiation of I/Os in lower levels of the design hierarchy, may require a modification in order to provide for simulation of the design with the reduced port map. In one implementation, the signal_spy functionality available in the ModelSim simulator from Mentor Graphics may be used for simulation. The signal_spy function, present in the modelsim_util-library, is an element of the simulation-libraries available to be used in HDL-designs. This function allows reading the value of any signal anywhere in a simulation-setup. The signal_spy-function can be used in the lower-level VHDL where the I/O resources are instantiated and reads values in another part of the test bench that are planned to stimulate the I/Os. As this function is non synthesizable, it needs to be hidden for synthesis by using "--pragma translate_off" and "--pragma translate_on" statements around it.

Example 4 shows example VHDL-code allowing I/Os in the lower level of the hierarchy to be connected to signals somewhere else in the test-bench. When the signals in a module PORT_FILE for the design are exercised, the same behavior will be present in the lower level hierarchy. With this approach, simulation of such a design is also possible.

```
library IEEE;
use IEEE. STD_LOGIC_1164.ALL;
use IEEE. STD_LOGIC_UNSIGNED.ALL;
use IEEE. NUMERIC_STD.ALL;
library modelsim_lib;
use modelsim_lib.util.all;
entity lower_level_hierarchy is
   Port ( . . .
      );
end lower_level_hierarchy;
architecture behavioral of lower_level_hierarchy is
   signal sig1::std_logic;
   signal sig2::std_logic;
begin
   --pragma translate_off
   Spy_process: process
   begin
      --connect the signal "bus_signal" to "bus_signal" in
      --"An/port_file/bus_signal" to copy every movement
      init_signal_spy("/tb/port_file", "sig1");
         init_signal_spy("/tb/port_file", "sig1");
      wait;
   end process;
   --pragma translate_on
End;
```

EXAMPLE 4

For ease of explanation the above examples are primarily described with reference to VHDL. It is recognized that the same is also possible using Verilog and other design-entry tools.

Figure 7:
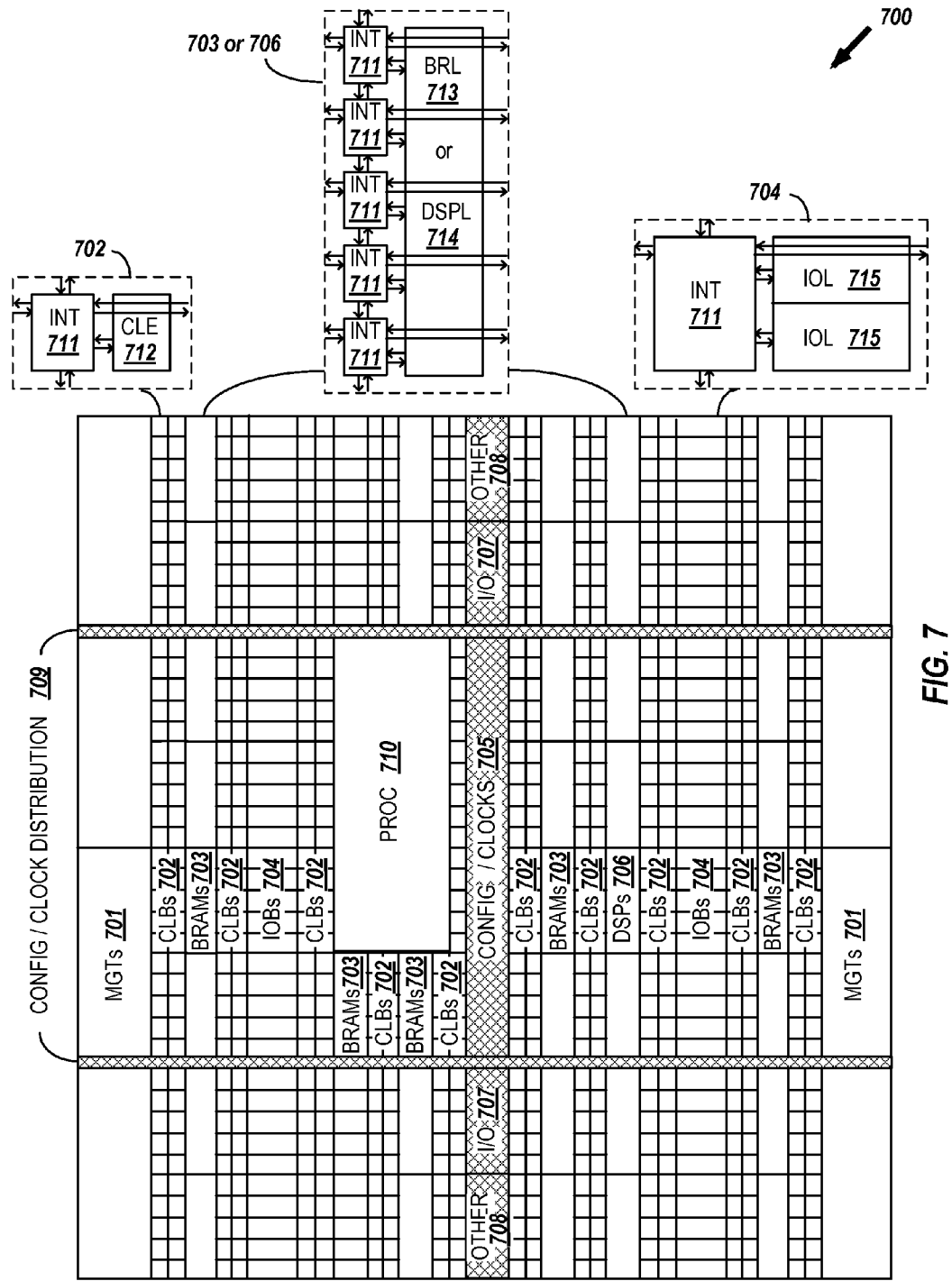
FIG. 7 shows an example programmable IC that may be configured with the disclosed processes.

FIG. 7 shows an example programmable integrated circuit (IC) that may be configured according to the above embodiments. The illustrated programmable IC is referred to as a Field Programmable Gate Array (FPGA). FPGAs can include several different types of programmable logic blocks in the array. For example, FIG. 7 illustrates an FPGA architecture (700) that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707), for example, e.g., clock ports, and other programmable logic 708 such as digital clock managers, analog-to-digital converters, system monitoring logic, and so forth. Some FPGAs also include dedicated processor blocks (PROC 710) and internal and external reconfiguration ports (not shown).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL 714) in addition to an appropriate number of programmable interconnect elements. An 10B 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments. In addition, the processes may be provided via a variety of computer-readable storage devices or delivery channels such as magnetic or optical disks or tapes, electronic storage devices, or as application services over a network.

Other aspects and embodiments will be apparent to those skilled in the art from consideration of the specification and practice disclosed herein. For example, in some applications one or more embodiments may be used to provide a certain level of intellectual property protection to prevent third parties from copying the complete FPGA configuration. For example, if a PCB was cloned at some third party production site, the FPGA of the board would only be configured with the generic configuration bitstream. The complete design may be provided to the hardware via license-protected software. If no licensed software is available to the potential buyer of a cloned board, the cloned hardware would be non-functional. It is intended that the specification and illustrated embodiments be considered as examples only, with a true scope and spirit of the various embodiments being indicated by the following claims.

What is claimed is:

1. A method of preparing a plurality of systems that include respective programmable integrated circuits (ICs) of the same type, comprising:
    identifying a set of input/output pins of the programmable IC, the set including each input/output pin used by a plurality of circuit designs for the programmable IC;
    partitioning each of the plurality of circuit designs into a base design and a respective supplemental design, the base design including at least the set of input/output pins, and each supplemental design corresponding to one of the plurality of circuit designs, the base design being the same for each of the plurality of circuit designs;
    generating a plurality of respective supplemental bitstreams for the supplemental designs;
    generating a first bitstream for implementing the base circuit design, a communication module, and a reconfiguration module in a first portion of programmable resources of the programmable IC, the reconfiguration module configured to program, in response to each respective one of the supplemental bitstreams received via the communication module, a second portion of the programmable resources with the supplemental bitstream to implement a corresponding one of the plurality of circuit designs; and
    storing the first bitstream in memories of each of the systems.

2. The method of claim 1, wherein a first one of the plurality of circuit designs has an input/output configuration that is different from a second one of the plurality of circuit designs.

3. The method of claim 1, wherein storing the first bitstream in respective memories of the systems includes:
    storing the first bitstream into a non-volatile memory of a first one of the systems that has a first hardware configuration compatible with an input/output configuration of a first one of the plurality of circuit designs; and
    storing the first bitstream into a non-volatile memory of a second one of the systems that has a second hardware configuration compatible with an input/output configuration of a second one of the plurality of circuit designs and incompatible with the input/output configuration of the first one of the plurality of circuit designs.

4. The method of claim 3, further comprising:
    delivering a first one of the supplemental bitstreams that corresponds to the first one of the plurality of circuit designs, to a purchaser of the first system; and
    delivering a second one of the supplemental bitstreams that corresponds to the second one of the plurality of circuit designs, to a purchaser of a second system.

5. The method of claim 1, further comprising:
    identifying one or more circuits included in each of the plurality of circuit designs; and
    wherein the partitioning of each of the plurality of circuit designs into a base design and a respective supplemental design includes instantiating the identified one or more circuits in the base circuit design.

6. The method of claim 1, wherein:
    the first bitstream implements the set of input/output pins with a first input/output configuration; and
    at least one of the supplemental bitstreams reconfigures one or more of the set of input/output pins to a second input/output configuration.

7. The method of claim 1, wherein the base circuit design includes one or more components implementing global clocking.

8. The method of claim 1, wherein the base circuit design instantiates the set of input/output pins as an INOUT bus.

9. The method of claim 1, wherein partitioning one of the plurality of circuit designs into the base design and a respective supplemental design includes instantiating one or more of the input/output pins in a lower level of the design hierarchy of the one of the plurality of circuit designs.

10. The method of claim 9, wherein partitioning one of the plurality of circuit designs into the base design and a respective supplemental design further includes generating a port file that maps each of the input/output pins in a lower level of the design hierarchy to a respective signal in a top level of the design hierarchy.

11. The method of claim 10, further comprising:
    for each of the supplemental designs, performing respective place and route operations to place and route the supplemental design and the base design together on the programmable IC; and
    placing constraints on the one or more input/output pins instantiated on the lower level, the constraints configured to prevent the input/output pins from being removed during placement and routing.

12. An electronic system, comprising
    a non-volatile memory storing a first bitstream; and
    a programmable IC coupled to the non-volatile memory, the programmable IC comprising:
        a first portion of programmable resources configured with the first bitstream to implement at least a communication module, a reconfiguration module, and one or more components included in both a first circuit design and a second circuit design, the reconfiguration module being configured to:
            in response to a second bitstream, corresponding to a first circuit design having a first input/output configuration, received via the communication module, configure a second portion of the programmable resources using the second bitstream to implement the first circuit design; and
            in response to a third bitstream, corresponding to a second circuit design having a second input/output configuration different than the first input/output configuration, received via the communication module, configure the second portion of the programmable resources using the third bitstream to implement the second circuit design.

13. The system of claim 12, wherein a first circuit design and second circuit design have different input/output configurations.

14. The system of claim 12, wherein the first bitstream implements one or more circuits included in each of the first and second circuit designs.

15. The system of claim 12, wherein:
the first bitstream implements a set of input/output pins with a third input/output configuration; and
at least one of the second and third bitstreams reconfigures one or more of the set of input/output pins to a input/output configuration different from the third input output configuration.

16. The system of claim 12, wherein the first bitstream implements one or more global clocking components.

17. The system of claim 12, wherein the first bitstream instantiates the set of input/output pins as an INOUT bus.

18. An article of manufacture, comprising:
a processor-readable storage device configured with instructions that when executed by one or more processors, cause the one or more processor to prepare a plurality of systems that includes respective programmable integrated circuits (ICs) of the same type by performing steps including:
identifying a set of input/output pins of the programmable IC, the set including each input/output pin used by a plurality of circuit designs for the programmable IC;
partitioning each of the plurality of circuit designs into a base design and a respective supplemental design, the base design including at least the set of input/output pins, and each supplemental design corresponding to one of the plurality of circuit designs, the base design being the same for each of the plurality of circuit designs;
generating a plurality of supplemental bitstreams for the supplemental designs;
generating a first bitstream for implementing the base circuit design, a communication module, and a reconfiguration module in a first portion of programmable resources of the programmable IC, the reconfiguration module configured to program, in response to each respective one of the supplemental bitstreams received via the communication module, a second portion of the programmable resources with the supplemental bitstream to implement a corresponding one of the plurality of circuit designs; and
storing the first bitstream in memories of the each of the plurality of systems.

19. The article of manufacture of claim 18, wherein storing the first bitstream in respective memories of the plurality of systems includes:
storing the first bitstream into a non-volatile memory of a first one of the systems that has a first hardware configuration compatible with an input/output configuration of a first one of the plurality of circuit designs; and
storing the first bitstream into a non-volatile memory of a second one of the systems that has a second hardware configuration compatible with an input/output configuration of a second one of the plurality of circuit designs and incompatible with the input/output configuration of the first one of the plurality of circuit designs.

20. The article of manufacture of claim 18, wherein:
the first bitstream implements the set of input/output pins with a first input/output configuration; and
at least one of the supplemental bitstreams reconfigures one or more of the set of input/output pins to a second input/output configuration.

\* \* \* \* \*